United States Patent [19]
Saito et al.

[11] Patent Number: 5,574,383
[45] Date of Patent: Nov. 12, 1996

[54] IC TESTER AND MEASURING METHOD

[75] Inventors: Takashi Saito; Shigeo Ikeda; Masumi Okutsu, all of Kanagawa, Japan

[73] Assignee: Sony Corporation, Tokyo, Japan

[21] Appl. No.: 382,808

[22] Filed: Feb. 2, 1995

[30]     Foreign Application Priority Data

Feb. 8, 1994  [JP]   Japan ................................. 6-036485

[51] Int. Cl.$^6$ ............................. G01R 1/04; G01R 31/26
[52] U.S. Cl. ............................................ 324/755; 439/71
[58] Field of Search ................................... 324/756–772; 439/71–72

[56]                References Cited

U.S. PATENT DOCUMENTS

| 4,739,257 | 4/1988 | Jenson et al. | 324/758 |
| 4,789,345 | 12/1988 | Carter | 439/71 |
| 4,869,636 | 9/1989 | Reid et al. | 441/331 |
| 5,068,601 | 11/1991 | Parmenter | 324/758 |
| 5,143,450 | 9/1992 | Smith et al. | 374/12 |
| 5,151,651 | 9/1992 | Shibata | 324/754 |
| 5,172,049 | 12/1992 | Kiyokawa et al. | 324/758 |

FOREIGN PATENT DOCUMENTS

| 6373344 | 4/1988 | Japan . |
| 63280431 | 11/1988 | Japan . |
| 1147382 | 6/1989 | Japan . |
| 1156169 | 6/1990 | Japan . |
| 2269979 | 11/1990 | Japan . |
| 3175650 | 7/1991 | Japan . |
| 3227549 | 10/1991 | Japan . |
| 3290943 | 12/1991 | Japan . |
| 495771 | 3/1992 | Japan . |
| 4168741 | 6/1992 | Japan . |
| 4225178 | 8/1992 | Japan . |
| 4251951 | 9/1992 | Japan . |
| 4332147 | 11/1992 | Japan . |
| 5144904 | 6/1993 | Japan . |

*Primary Examiner*—Kenneth A. Wieder
*Assistant Examiner*—Barry C. Bowser
*Attorney, Agent, or Firm*—Hill, Steadman & Simpson

[57]              ABSTRACT

An IC measuring and testing device and measuring and testing method comprising a measurement handler socket provided with mold-receiving base having guiding members corresponding to the shape of a mold body of an IC to be tested around its periphery and probes for contacting outer leads of the IC, and a suction arm for suction-supporting the IC and transferring it to the mold-receiving base, the IC measuring and testing device performing measuring and testing on the IC mounted in the mold-receiving base by means of the suction arm, the guide members corresponding to and separated from the outer leads of the IC, and terminal portions of the probes being arranged inserted into these separation portions. As a result, when the IC is set, the guide members and the like of the socket can be prevented from striking against the outer leads of the IC and deforming them.

5 Claims, 10 Drawing Sheets (related art)

(related art)

IC TESTER AND MEASURING METHOD

BACKGROUND OF THE INVENTION

1. Field of the Invention

The present invention relates to measuring and testing equipment for semiconductor integrated circuits (ICs), and in particular to those devices which mount an IC and perform measuring and testing utilizing a measurement handler socket provided with probes which are brought into contact with outer leads arranged around the periphery of the IC mounting to achieve conduction.

2. Description of the Related Art

Semiconductor integrated circuits (semiconductor devices) are subjected to various function tests after manufacture, using a measurement handler. The structures of conventional IC measuring and testing devices are shown in FIGS. 1 and 2, of which FIG. 1 is a perspective view while FIG. 2 is a side view. As shown in these drawings, a mold-receiving base 2 is provided in the central portion of a measurement handler socket (hereinafter referred to simply as a socket) 1. This mold-receiving base 2 corresponds to the shape of the mold body 5 of the IC 4 to be measured, for example a rectangular shape, and guide members 7 for guiding the mold body 5 are formed in the four sides of the rectangle.

The IC 4 to be measured comprises the mold body 5 which has a top surface (upper surface) 5a and a bottom surface (lower surface) 5b, with a plurality of outer leads 6 provided protruding from the four edge surfaces around the periphery of the mold body 5. Each outer leads 6 protrudes horizontally form the edge of the mold body 5 to form a shoulder portion 6a at its root portion, is bent downward therefrom, and is then bent horizontally again at its end to form a leg portion 6b.

A plurality of probes 3 are provided at the peripheries of the four sides of the mold-receiving base 2 and corresponding to the outer leads 6 of the IC 4. The mold-receiving base 2 is mounted on a substrate 9 via a spring 12.

The IC 4 to be measured is suction-supported by a suction arm 11 for handling, such as a vacuum chuck or the like, on the top surface 5a thereof, is lowered onto the mold-receiving base 2 in the direction of the arrow A, the bottom surface 5b of the mold body 5 is guided in the direction of arrow B along the guide member 7, and thereby the IC 4 is set into the socket 1.

FIGS. 3A to 3E are explanatory diagrams of the procedures of an IC measuring and testing method of the related art. First, as shown in FIG. 3A, the suction-supported IC 4 whose top surface 5a is raised by the suction arm 11 is aligned in a position sufficiently close to the mold-receiving base 2 above the socket 1 by an image processing or other suitable positioning means. There the vacuum of the suction arm 11 is released and the IC 4 is dropped into place. By this means, as shown in FIG. 3B, the mold body 5 of the IC 4 is seated and supported within the guide member 7 surrounding the mold-receiving base 2. In this state the end horizontal portions (leg portions) 6b of the outer leads 6 of the IC 4 are in a non-contact state separated from above the probes 3.

Next, as shown in FIG. 3C, contactors 10 are lowered to push down the leg portions 6b of the outer leads 6 of the IC 4 against the resistance of the spring 12, thus causing the outer leads 6 to contact and obtain conduction with the corresponding probes 3. In this state, predetermined measuring and testing can be performed on the IC 4 by a measuring and testing circuit (not shown) connected thereto via the terminals 3a of the probes 3.

Upon completion of the predetermined measuring and testing and acquisition of desired measurement data, the contactors 10 are raised and separated from the outer leads 6 as shown in FIG. 3D, by which means the outer leads 6 are separated from the probes 3. Subsequently, the suction arm 11 is lowered to suction-support the top surface 5a of the mold body 5 of the IC 4 and then raised, extracting the IC 4 from the mold-receiving base 2 as shown in FIG. 3E and transferred it to the next process.

However, in the IC measuring and testing method by means of a conventional measurement handler as described above, the outer leads 6 of the IC 4 can strike against the guide members 7 of the socket 1 when the IC 4 is set in the socket 1 due to slight alignment errors or inconsistencies in the outer dimensions of the IC, leading to the possibility of deformation of the leads. This is likely to occur particularly in cases where the IC itself is large and has many pins or where the leads are miniaturized.

SUMMARY OF THE INVENTION

The object of the present invention is to provide an IC measuring and testing device which can overcome the disadvantage of leads deforming due to the guide members etc. of the socket striking against the outer leads of the IC when the IC is set.

The present invention was designed in order to achieve this object, and is an IC measuring and testing device which comprises a measurement handler socket, provided with a mold-receiving base having around its periphery guide members corresponding to the shape of an IC mold body to be measured and probes for contacting the outer leads of the IC, and a handling means for suction-supporting the IC and mounting it in the mold-receiving base, and which performs measuring and testing of an IC mounted on the mold-receiving base by means of the handling means, wherein the guide members separate the corresponding outer leads of the IC and the end portions of the probes are arranged so as to be inserted into these separated portions.

A pressure member is also provided in the present invention for applying pressure from above on the IC mounted in the mold-receiving base by the handling means, via the mold body.

The present invention is further provided with guide members at the four sides of the rectangular shaped mold-receiving base.

The present invention also includes a method for performing measuring and testing of the IC in the IC measuring and testing device, in which, firstly, the IC to be measured is suction-supported by the handling means, then the IC suction-supported by the handling means is mounted facing the mold-receiving base in a state where its top surface is facing downward, whereafter the root portions of the outer leads extending from the mold body are brought into contact with the probe terminal portions within the separated portions by the bottom surface of the mold body of the IC being depressed from above by the handling means, so that conduction is obtained between the outer leads and the probes.

In addition, the present invention is a method for performing measuring and testing of an IC using an IC measuring and testing device wherein, firstly, the IC to be measured is suction-supported by the handling means, then the IC suction-supported by the handling means is mounted facing the mold-receiving base in a state where its top surface is facing downward, whereafter the root portions of the outer leads extending from the mold body are brought into contact with the probe terminal portions within the separated portions by the bottom surface of the mold body of the IC being subjected to pressure from above by the pressure member, so that the electrical conduction is achieved between outer leads and the probes.

In the present invention, since the guide members provided around the periphery of the mold-receiving base are separated from the corresponding outer leads of the IC and the terminal portions of the probes are arranged inserted into the separation portion, the mold body is guided by the guide members when the IC to be measured is mounted in the mold-receiving base with the top surface of the IC facing downward, by which means the guide members etc. of the socket do not contact and are not deformed by the outer leads.

Also in the present invention, with regard to the IC mounted in the mold-receiving base, by applying pressure on the bottom surface of the mold body of the IC from above by way of the handling means, the root portions of the outer leads are brought into contact with the probes arranged in the separation portions of the guide members and conduction can be achieved between the outer leads and probes.

Further, in the present invention, with regard to the IC mounted in the mold-receiving base as described above, by applying pressure on the bottom surface of the mold body of the IC from above by means of the pressure member, the root portions of the outer leads are brought into contact with the probes arranged in the separation portions of the guide members and conduction can be attained between the outer leads and the probes.

BRIEF DESCRIPTION OF THE DRAWINGS

These and other features, aspects and advantages of the present invention will become better understood with reference to the following description, appended claims and accompanying drawings wherein

DETAILED DESCRIPTION OF THE PREFERRED EMBODIMENTS

Hereafter, embodiments of the present invention will be described in detail with reference to the drawings.

Figure 1:
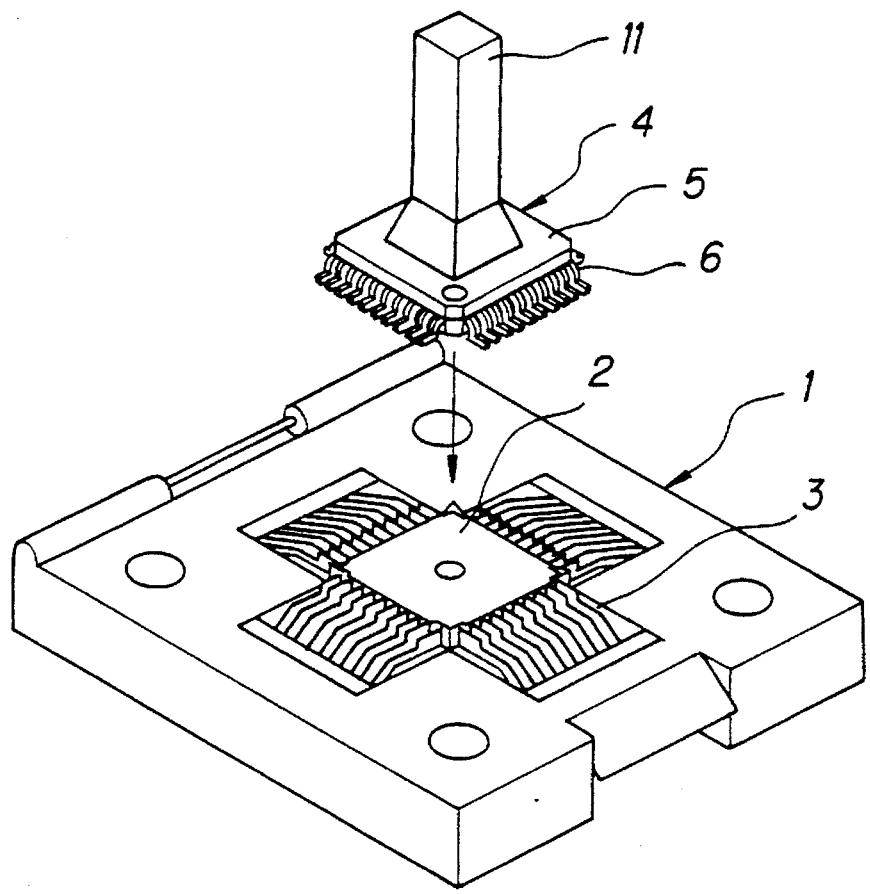
FIG. 1 is a perspective view showing a conventional IC measuring and testing device.
Figure 2:
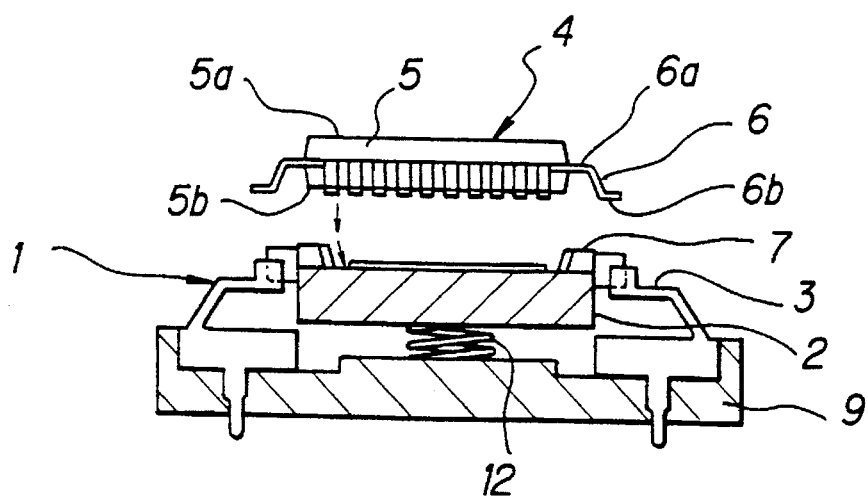
FIG. 2 is a cross-sectional side view of the conventional IC measuring and testing device.
Figure 3A:
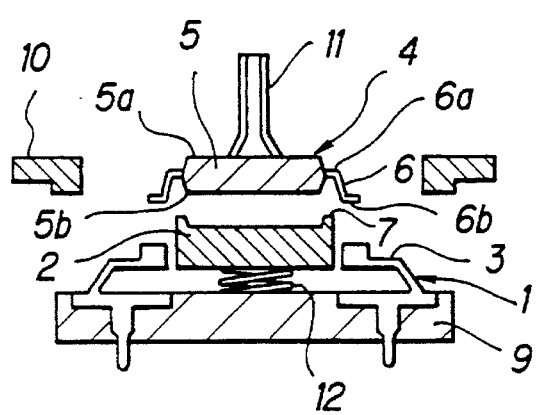
FIG. 3A is a cross-sectional side view of a conventional IC measuring and testing method, showing a suction-supported IC whose top surface is raised by a suction arm and aligned at a position sufficiently close to a mold-receiving base above a socket.
Figure 3B:
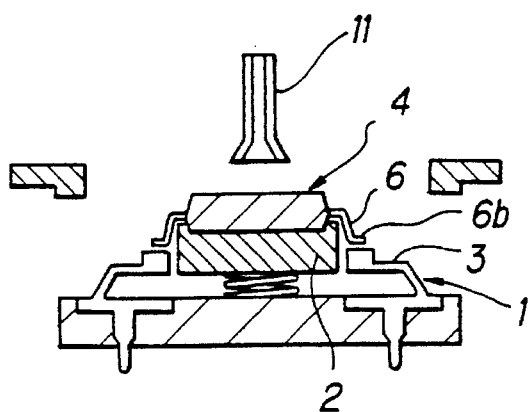
FIG. 3B is a cross-sectional side view of a conventional IC measuring and testing method, showing the IC being dropped into place by the release of the vacuum of the suction arm so that the mold body of the IC is seated and supported within a guide member surrounding the mold-receiving base.
Figure 3C:
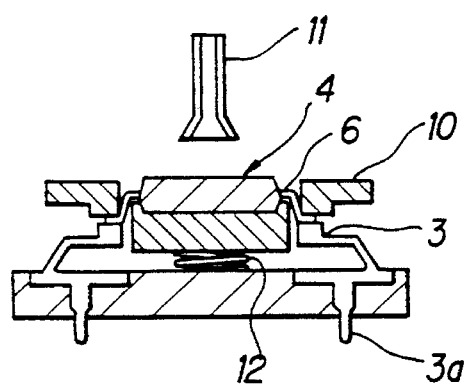
FIG. 3C is a cross-sectional side view of a conventional IC measuring and testing method, showing contactors being lowered to push down leg portions of outer leads of the IC against the resistance of a spring, thus causing the outer leads to contact and achieve conduction with corresponding probes.
Figure 3D:
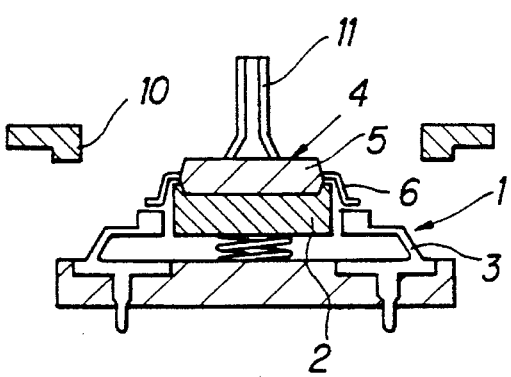
FIG. 3D is a cross-sectional side view of a conventional IC measuring and testing method, showing the contactors being raised and separated from the outer leads, separating the outer leads from the probes.
Figure 3E:
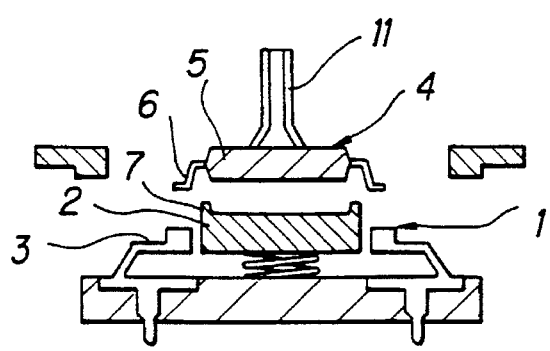
FIG. 3E is a cross-sectional side view of a conventional IC measuring and testing method, showing the suction arm being lowered to suction-support the top surface of the mold body of the IC and then raised, extracting the IC from the mold-receiving base and transferring it to the next process.
Figure 4:
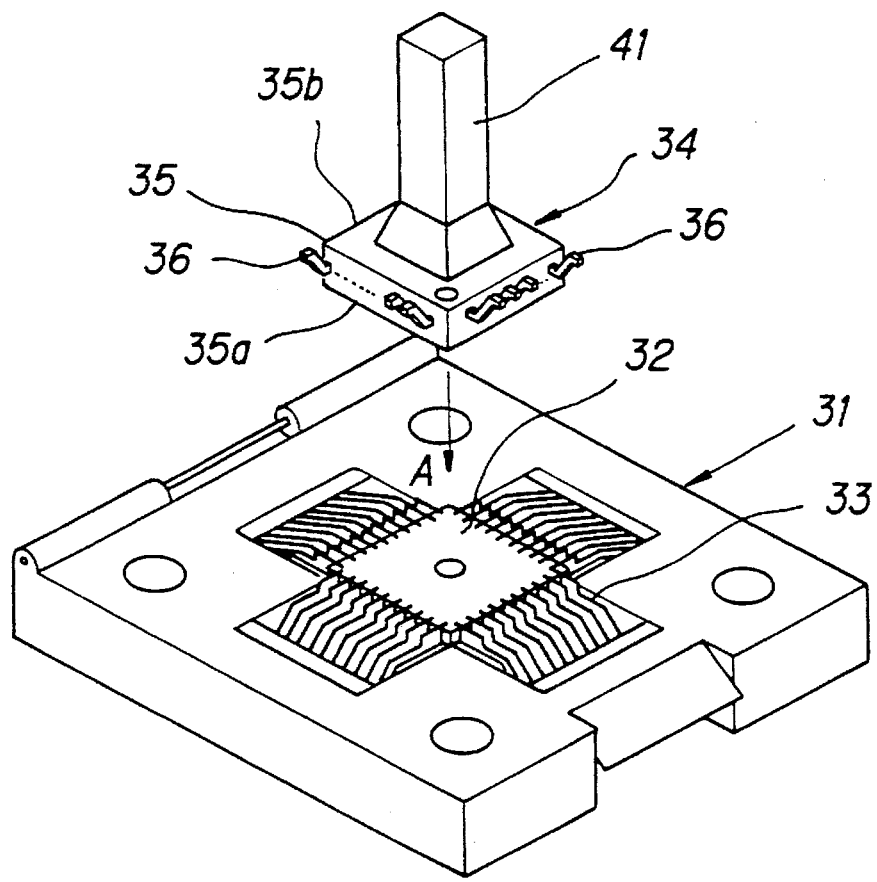
FIG. 4 is a perspective view showing a first embodiment of an IC measuring and testing device according to the present invention.
Figure 5:
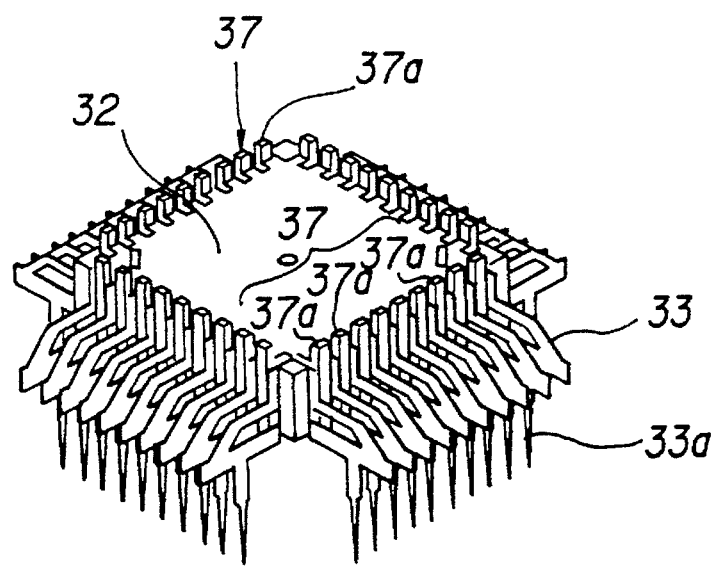
FIG. 5 is an enlarged perspective view showing the main components of the mold-receiving base 2 shown in FIG. 4.
Figure 6:
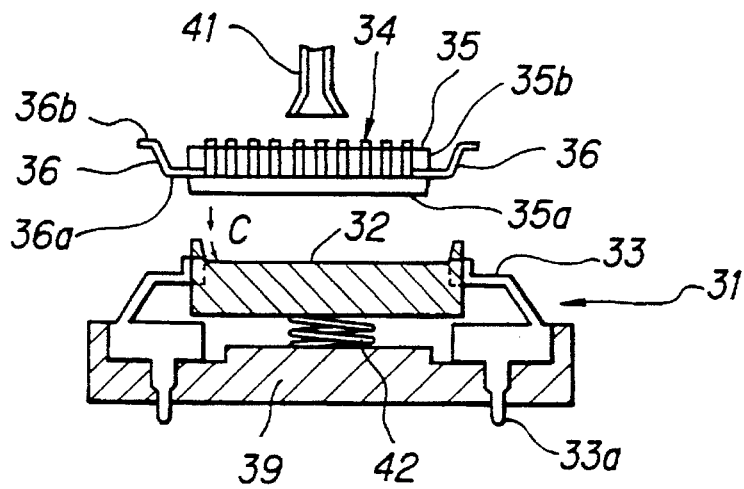
FIG. 6 is a cross-sectional side view of the device shown in FIG. 4.

FIG. 4 is a perspective drawing showing a first embodiment of an IC measuring and testing device according to the present invention, FIG. 5 is an enlargement of the main components thereof, and FIG. 6 is a side view thereof. As shown in the drawings, a mold-receiving base 32 is provided in the central portion of the socket 31. This mold-receiving base is of a shape corresponding to the shape of a mold body 35 of an IC to be measured, for example a rectangular shape, and guide members 37 (FIG. 5 and FIG. 6) for guiding the mold body 35 are formed on the outer edges of the four sides of this rectangular shape. These guide members 37 comprise a plurality of guide edges 37a separately arranged corresponding to the positions of a plurality of outer leads 36 of the IC 34.

The IC 34 to be measured comprises the mold body 35 having a top surface (upper surface) 35a and a bottom surface (lower surface) 35b, the mold body 35 being provided a plurality of outer leads 36 extending from the four side surfaces surrounding the mold body 35. The outer leads 36 extend from the side surfaces of the mold body 35, form shoulder portions 36a at the lead root portion thereof, bend downward therefrom, and further bend horizontally at their end portions to form leg portions 36b.

The mold-receiving base 32 is mounted on a substrate 39 via a spring 42. Outside the four sides of the mold-receiving base 32 are provided a plurality of probes corresponding to the outer leads 36 of the IC 34. The end portions of the probes 33 are inserted in the gaps of the separation portions of the guide members 37, i.e. between each of the abutting guide edges 37a.

The IC 34 to be measured, in a state wherein it is inverted so that the top surface 35a is facing downward (the bottom surface 35b faces upward), is suction-supported at its bottom surface 35b by a suction arm 41 for handling, such as a vacuum chuck or the like. The IC 34 inverted and supported in this manner is lowered onto the mold-receiving base 32 as shown by arrow A (FIG. 4) and the upper surface 35a of the mold body is guided along the guide members 37 as shown by arrow C (FIG. 6), by which means the IC 34 is set in the socket 31.

Figure 7A:
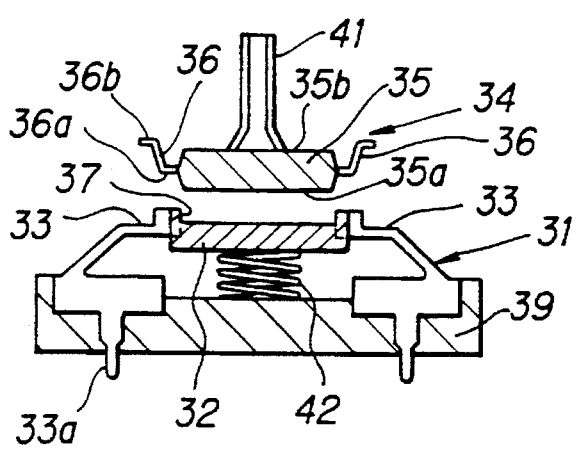
FIG. 7A is a cross-sectional side view of a second embodiment of the present invention, which is an IC measuring and testing method, showing the bottom surface of an IC being suction-supported by the suction arm to align the IC at a position sufficiently close to the mold-receiving base above the socket.

FIGS. 7A to 7D are explanatory drawings showing the procedures of an IC measuring and testing method according to a second embodiment of the present invention and utilized in the device of the first embodiment. First, as shown in FIG. 7A, the bottom surface 35b of the IC 34, which has been inverted and is at the top thereof, is suction-supported by the suction arm 41, and the IC 34 is aligned to a position sufficiently close to the mold-receiving base 32 above the socket 31 by an imaging process or another suitable positioning means.

Figure 7B:
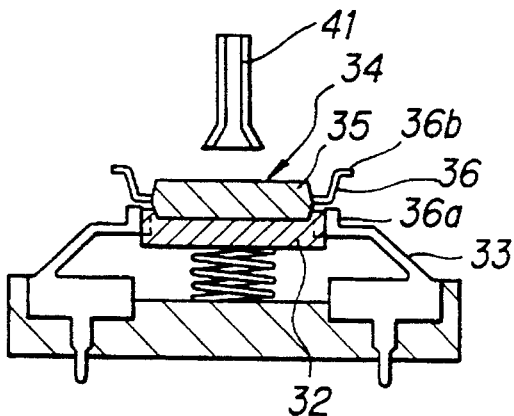
FIG. 7B is a cross-sectional side view of the IC measuring and testing method of the second embodiment of the present invention, showing the IC being dropped into place by the release of the vacuum of the suction arm the top surface of the mold body being guided into the guide members at the periphery of the mold-receiving base with the leg portions of the outer leads facing upwards.

At this point, as shown in FIG. 7B, the vacuum of the suction arm 41 is released to drop the IC 34, thereby guiding the top surface 35a of the mold body 35 of the IC 34 into the guide members 37 at the periphery of the mold-receiving base 32 so that the IC 34 is set on the mold-receiving base 32 in a state where the end of the leg portions 36b of the outer leads 36 are facing upwards. In this state, the shoulder portions 36b of the outer leads 36 are separated from the probes 33, i.e. in a state wherein they are disconnected. Also, the outer leads 36 are positioned above gaps formed between the guide edges 37a (refer to FIG. 5) of the guide members 37. Further, the probes 33 are inserted in the gaps between the guide edges 37a corresponding to the outer leads 36.

Figure 7C:
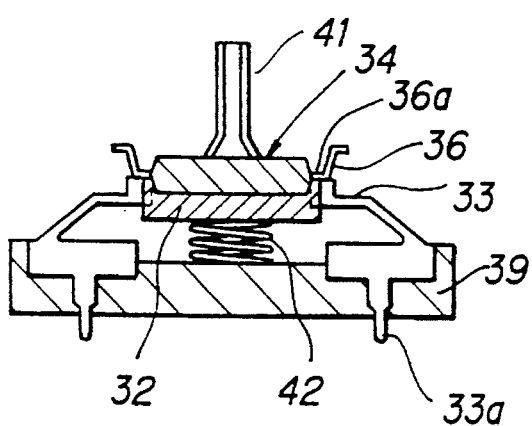
FIG. 7C is a cross-sectional side view of the IC measuring and testing method of the second embodiment of the present invention, showing the suction arm being lowered to depress the bottom surface of the IC downwards against the resistance of the spring, thus causing the shoulder portions of the outer leads to contact the end portions of the probes and achieve electrical conduction.

Next, as shown in FIG. 7C, the suction arm 41 is lowered to depress the bottom surface 35b of the IC 34 and push it downwards against the resistance of the spring 42. By this means, the shoulder portions 36a of the outer leads 36 contact the end portions of the probes 33 and achieve electrical conduction. In this state, various types of signal transmissions with a measuring and testing circuit (not shown) via the terminals 33a of the probes 33 are performed, so that predetermined measuring and testing is performed on the IC 34.

Figure 7D:
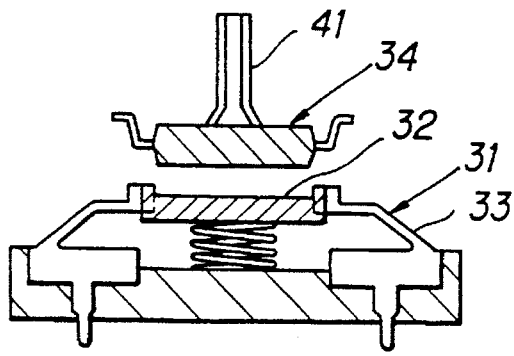
FIG. 7D is a cross-sectional side view of the IC measuring and testing method of the second embodiment of the present invention, showing the suction arm being raised and the IC being extracted from the socket upon completion of predetermined measuring and testing and acquisition of desired measurement data, to be transferred to the next process.

Upon completion of the predetermined measuring and testing and acquisition of desired measurement data, the suction arm 41 is raised and the IC 34 is extracted from the socket 31 as shown in FIG. 7D, and is transferred to the next process.

In the IC measuring and testing device of the second embodiment, since a conductive state between the outer leads 36 and the probes 33 is obtained by the suction arm 41 applying pressure from above on the bottom surface 35b of mold body 35 of the IC 34, this IC measuring and testing device corresponds to any package shape in which the IC 34 thereof has shoulder portions 36a at the root portions of the outer leads 36, i.e. not only surface-mounted type packages such as QFPs (quad flat packages), SOPs (small outline packages) and the like, but also pin-insertion type packages such as DIPs (dual inline packages), S-DIPs (shrink dual inline packages) and the like, and further, surface-mounted type packages such as QFJs (quad flat J-leaded packages), SOJs (small outline J-leaded packages) and the like.

Figure 8:
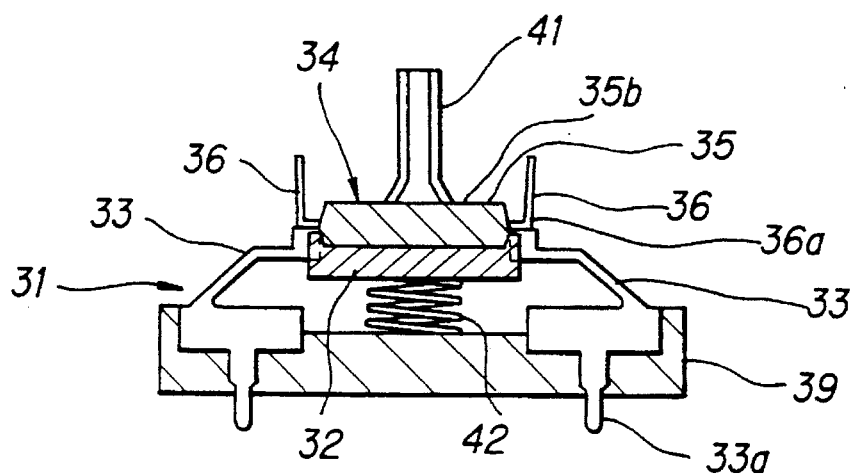
FIG. 8 is a cross-sectional side view showing an example of the device of the first embodiment of the present invention applied to a DIP type IC.

FIG. 8 shows an example wherein the present invention is applied specifically to a DIP-type IC 34 from among the various package shapes described above, this case being the same as the above-described embodiment, wherein conduction is attained between the outer leads 36 and the probes 33 by the suction arm 41 applying pressure from above on the bottom surface 35b of the mold body 35 of the IC 34.

Also, in the conventional IC measuring and testing device previously described, as shown in FIG. 3, since the outer leads 6 of the IC 4 mounted on the mold-receiving base 2 are of a structure such that they are depressed by the connectors 10, during repetition of measuring and testing, solder with which the outer leads 6 are plated transfers to the connectors 10, so that maintenance for removing this solder which has become attached to the connectors 10 must necessarily be performed at regular intervals so that short circuiting and the like does not occur between the leads when continuing measuring and testing in such a state. However, because the first embodiment has a structure wherein the mold body 35 of the IC 34 mounted on the mold-receiving base 32 is depressed by the suction arm 41, and the outer leads do not make contact, the above-described maintenance is unnecessary.

Figure 9:
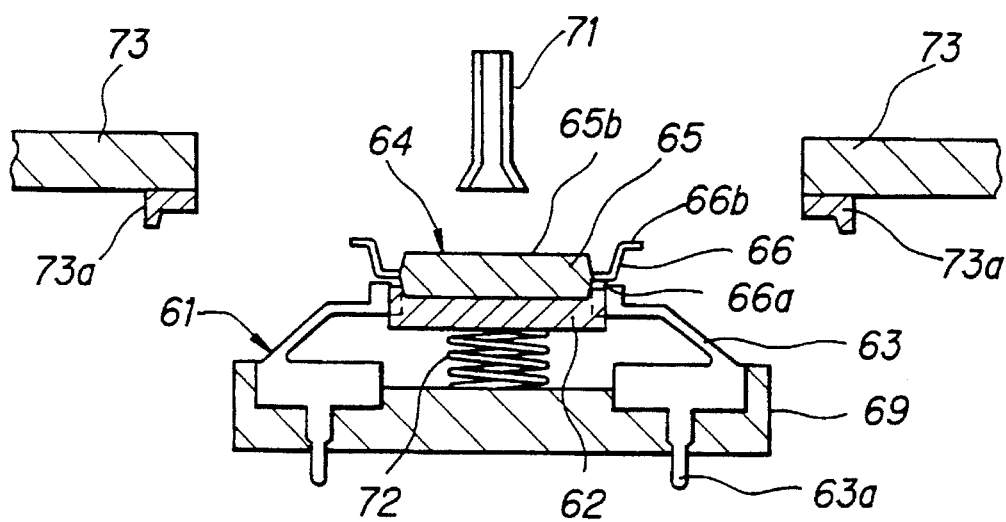
FIG. 9 is a cross-sectional side view showing a third embodiment of an IC measuring and testing device according to the present invention.

FIG. 9 is a side view showing a third embodiment of the IC measuring and testing device according to the present invention. In this drawing, 61 is a socket, 62 is a mold-receiving base, 63 are probes, 67 are guide members, 69 is a substrate, 71 is a suction arm, and 72 is a spring, the structures of which are the same as in the case of the first embodiment.

In this third embodiment, in addition to the above-described structures, a pressure member 13, for applying pressure from above on the IC 64 mounted on the mold-receiving base 62 by the suction arm 71 via the mold body 65 thereof, are provided.

Figure 10:
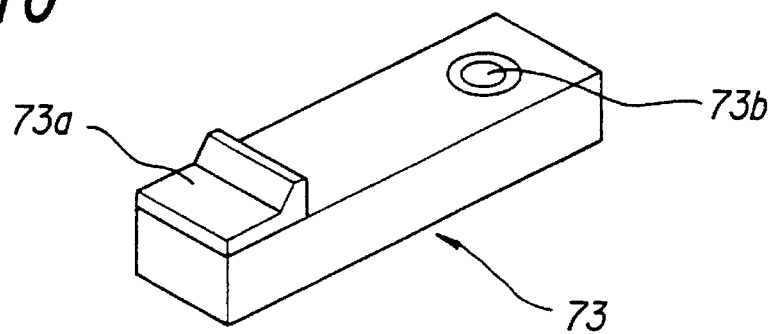
FIG. 10 is a perspective view showing the shape of a pressure member of the third embodiment.

FIG. 10 is a perspective view showing the shape of a pressure member of the third embodiment. As shown in the drawing, a pressure portion 73a, made from an insulating material for example, is provided on a surface of the end portion of the pressure member 73 facing the mold body 65. This pressure portion 73a is formed corresponding to the shapes of the outer leads 66 and the mold body 65 of the IC 64 to be measured. Also, an attachment hole 37b is perforated in the end portion of the pressure member 73, the pressure member 73 being fixed by a driving means (not shown) via this attachment hole 73b. At this point, the driving means described above moves the pressure member 73 in the up and down or left and right directions according to a predetermined procedure.

Next, an IC measuring and testing method according to a fourth embodiment will be described. Firstly, in the same manner as is shown in FIG. 7A described above, the bottom surface 65b of the IC 64, which has been inverted and faces upwards, is suction-supported by the suction arm 71, and the IC 64 is aligned to a position sufficiently close to the mold-receiving base 62 above the socket 61 by an imaging process or another suitable positioning means.

At this point, in the same manner as is shown in FIG. 7B, the vacuum of the suction arm 61 is released to drop the IC 64, thereby guiding the top surface 65a of the mold body 65 of the IC 64 into the guide members 67 at the periphery of the mold-receiving base 62 so that the IC 64 is set on the mold-receiving base 62 in a state where the end of the leg portions 66b of the outer leads 66 are facing upwards.

In this state, the shoulder portions 66b of the outer leads 66 are separated from the probes 63, i.e. in a state wherein they are disconnected. Also, the outer leads 66 are positioned above gaps formed between the guide edges 67a of the guide members 67. Further, the probes 63 are inserted in the gaps between the guide edges 67a corresponding to the outer leads 66.

Then, when the IC 64 has been mounted on the mold-receiving base 62, the suction arm 71 is retracted away from the socket 61.

Figure 11A:
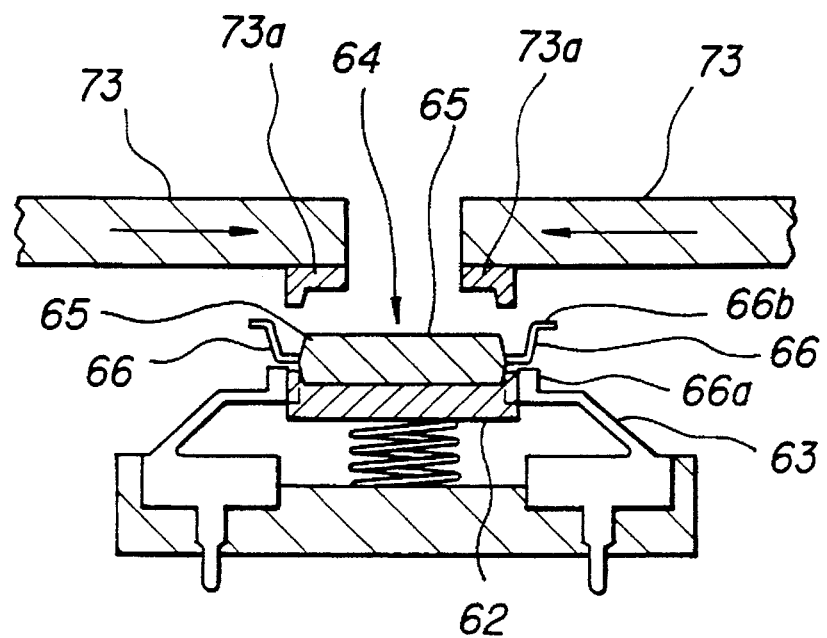
FIG. 11A is a cross-sectional view of an IC measuring and testing method according to a fourth embodiment of the present invention, showing the pressure member disposed at the periphery of the socket being advanced in two or four directions, positioning and arranging the pressure member above the IC.

Next, as shown in FIG. 11A, the pressure member 73 disposed at the periphery of the socket 61 is advanced in two or four directions as shown by the arrows on the drawing, positioning and arranging the pressure member 73 above the IC 64.

Figure 11B:
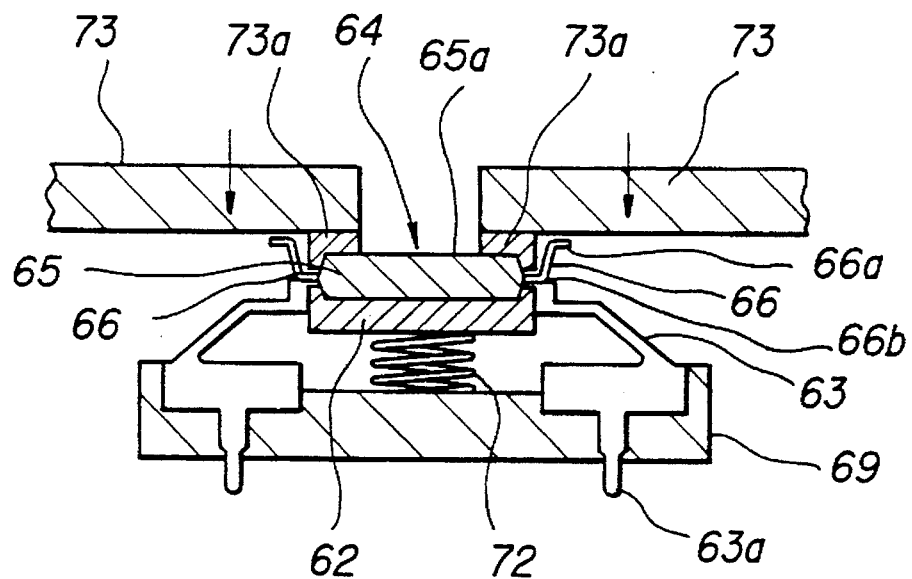
FIG. 11B is a cross-sectional view of the IC measuring and testing method according to the fourth embodiment of the present invention, showing the pressure member being lowered and the bottom surface of the mold body of the IC being depressed by pressure portions to push the IC downwards against the resistance of the spring, thus causing the shoulder portions of the outer leads to contact the end portions of the probes and achieve electrical conduction.

Subsequently, as shown in FIG. 11B, the pressure member 73 is lowered and the bottom surface 65b of the mold body 65 of the IC 64 is depressed by the pressure portions 73a provided at the end portions thereof to push the IC 64 downwards against the resistance of the spring 72. Thereby, the shoulder portions 66a of the outer leads 66 contact the end portions of the probes 63, and achieve electrical conduction. In this state, various types of signal transmissions with a measuring and testing circuit (not shown) via the terminals 63a of the probes 63 are performed, so that predetermined measuring and testing is performed on the IC 64.

Upon completion of the predetermined measuring and testing and acquisition of desired measurement data, the pressure member 73 is raised from the state shown in FIG. 11B so that it is retracted to the periphery of the socket 71 and the IC 64 is again suction-supported by the suction arm (not shown) for IC extraction and transferred to the next process.

In this way, because the third and fourth embodiments are provided with the pressure member 73 for applying via the mold body 65, pressure from above on the IC 64 mounted in the mold-receiving base 62 after the IC 64 suction-supported by the suction arm 71 is mounted in the mold-receiving base 62, by using the pressure member 73 to depress the mold body 65 and thereby achieve conduction between the outer leads 66 and the probes 63, the next IC 64 to be measured can be suction-supported by the suction arm 71 while the pressure member is depressing the mold body 65 of the currently measured IC 64 downward, then the IC 64 after measuring can be extracted from the socket 61 by a suction arm (not shown) for IC extraction, enabling the next IC 64 to be measured to be mounted in the mold-receiving base 62.

Figure 12:
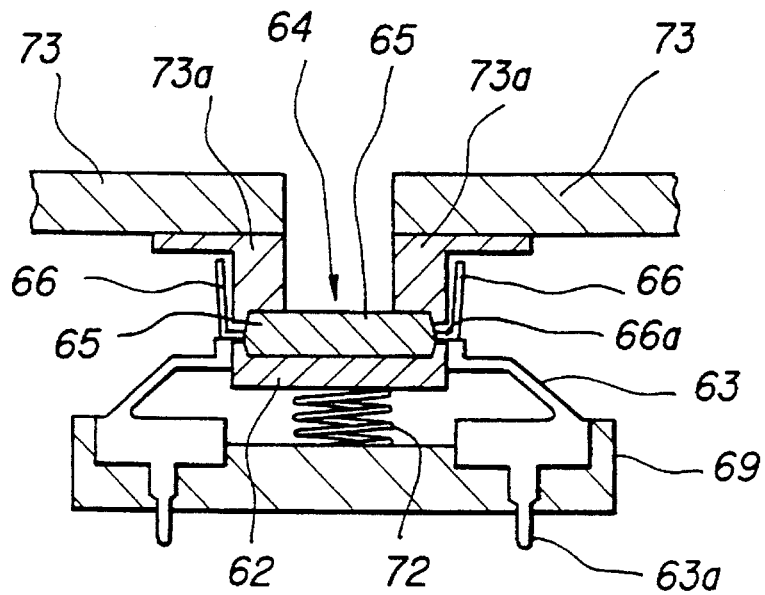
FIG. 12 is a view showing an example of the device of the third embodiment of the present invention applied to a DIP type IC.

Also in the third and fourth embodiments, by forming the shapes of the pressure portions 73a of the pressure member 73 to correspond to the package shape of the IC 64, in not only surface-mounted type QFP and SOP ICs, but any type of ICs, if they are ICs 64 having shoulder portions 66a at the root portions of the outer leads 66 (S-DIPs, QFJs, SOJs, etc.), such as the DIP-type IC 64 shown FIG. 12 for example, the root portions (shoulder portions 66a) of the outer leads protruding from the mold body 65 can be brought into contact with the end portions of the probes 63 within the separation portions of the guide members 67 to achieve conduction between the outer leads 66 and the probes 63, by applying pressure on the mold body 65 of the IC 64 from above with the pressure portions 73a of the pressure member 73 as shown in the drawings.

Further, since the third and fourth embodiments have structures wherein the mold body 65 of the IC 64 mounted in the mold-receiving base 62 is depressed by the pressure member 73 and there is no contact with the outer leads 66 as in the previously described prior art, it is not necessary to perform maintenance to periodically remove solder attached to contactors 70.

Note that in the structures of the third and fourth embodiments, the shape of the pressure member 73 need not be restricted to that shown previously in FIG. 10, but may be variously shaped according to the shapes of the mold body 65 of the IC 64 and outer leads thereof.

Figure 13A:
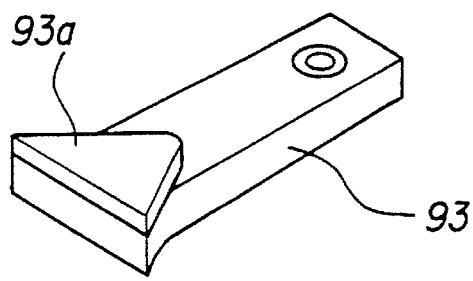
FIG. 13A is a perspective view showing the shape of a pressure member in a fifth embodiment of the present invention which is used in the IC measuring and testing device of the second embodiment.
Figure 13B:
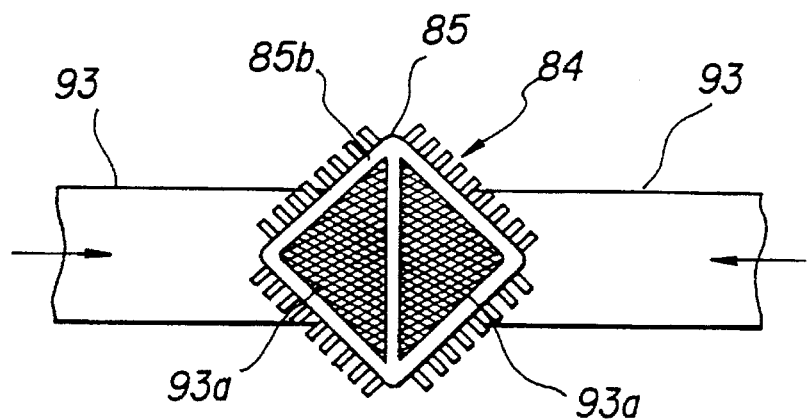
FIG. 13B is a plan view of pressure members as shown in FIG. 13A being applied to an IC, advancing from opposite directions and enabling uniform pressure to be applied to the bottom surface of the mold body.

Next, a fifth embodiment of the present invention will be described. Even if the IC is of the same QFP type as described above, a pressure portion 83a of triangular shape disposed at the end of the pressure member 83, as shown in FIG. 13A for example, can be provided as the pressure member for applying pressure on the IC from above, the pressure portions of this pressure member advancing from opposite directions of the IC mounted in the mold-receiving body as shown in FIG. 13B, enabling uniform pressure to be applied to the bottom surface 85b of the mold body 85.

Figure 14A:
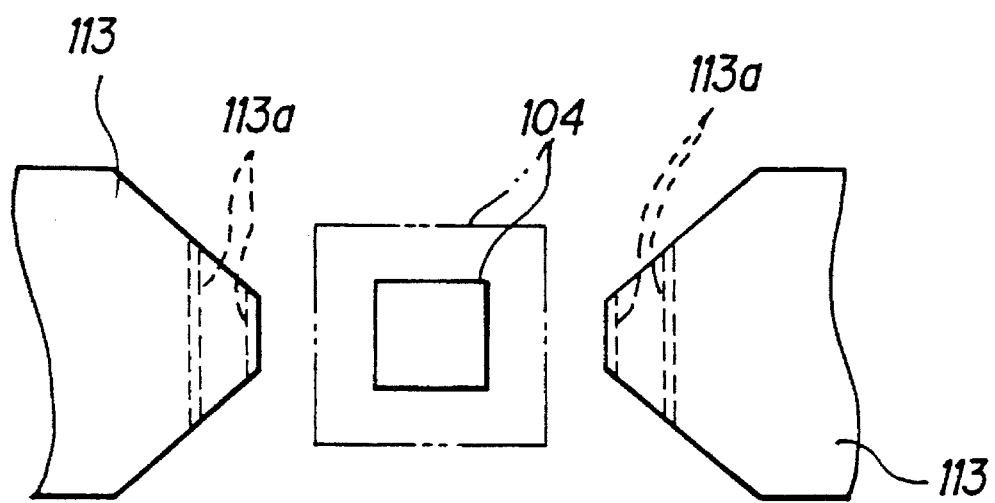
FIG. 14A is a plan view of pressure portions of a pressure member of a sixth embodiment of the present invention and the operation thereof.
Figure 14B:
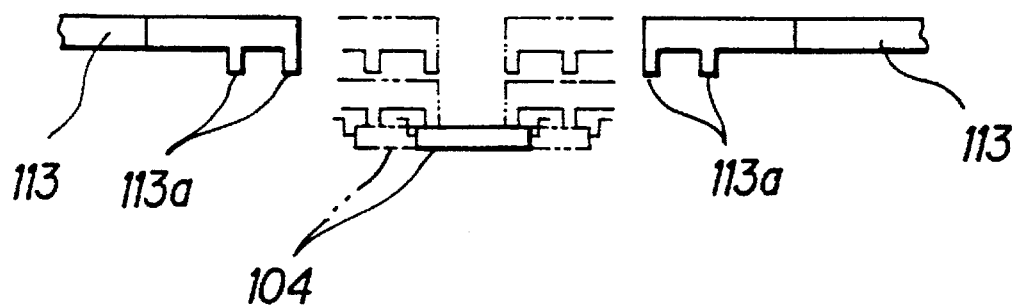
FIG. 14B is a side view of the pressure portions of the pressure member shown in FIG. 14A and the operation thereof.

FIG. 14 is an explanatory drawing of a sixth embodiment of the present invention which is an example of a variation in shape of the third embodiment, FIG. 14A being a plan block drawing thereof, and FIG. 14B being a side block drawing thereof. In the drawings, the ends of the pressure member 113 are formed in a thin tapering shape, providing pressure portions 113a of protruding shape in predetermined gaps in the lower surface of the thin portion thereof. These pressure portions 113a are portions for applying pressure from directly above the mold body 105 of the IC 104 mounted in a mold-receiving base (not shown), the gaps thereof being set corresponding to the outer dimensions of the IC 104 to be measured.

Figure 15A:
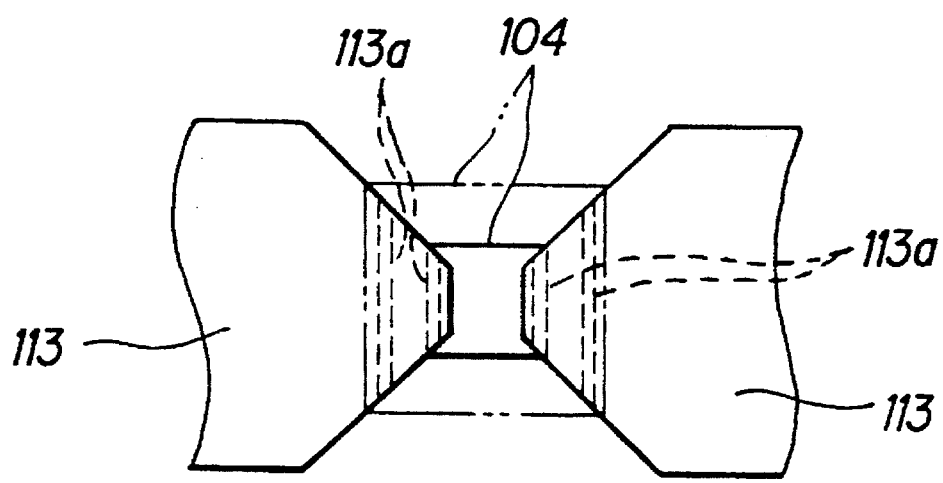
FIG. 15A is another plan view of pressure portions of the pressure member of the sixth embodiment and the pressure operation thereof.
Figure 15B:
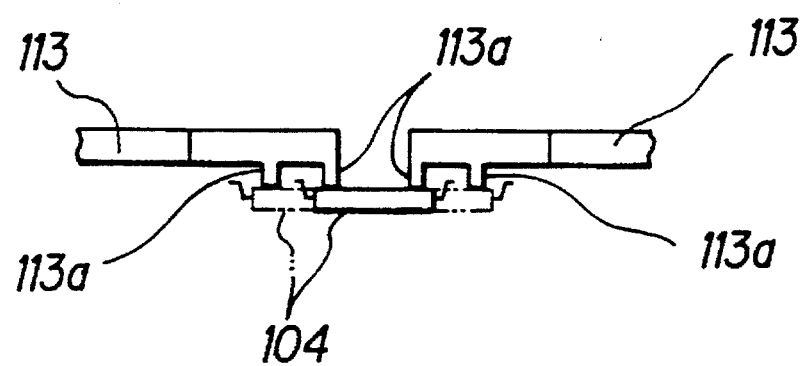
FIG. 15B is another side view of the pressure portions of the pressure member shown in FIG. 15A and the pressure operation thereof.

In other words, in the case of applying pressure on an IC 104 whose outer dimensions are small, as shown by the solid lines in the drawing, by advancing the pressure member 113 shown in FIG. 14B to a position above the IC 104 then lowering it, the pressure portions 113a provided extending from the ends as shown in FIGS. 15A and 15B can applying pressure from above on a small IC 104.

On the other hand, in the case of applying pressure to an IC 104 whose outer dimensions are large as shown by the double broken lines in the drawing, in the same manner as that described above, by advancing the pressure member 113 shown in FIG. 14B to a position above the IC 104 and lowering it, the IC 104 can be depressed from above by both the pressure portions 113a provided extending from the ends as shown in FIGS. 15A and 15B and further pressure portions provided extending therefrom.

In the modes of these embodiments, since one pressure member 113 can be commonly used even in cases where the outer dimensions of the IC 104 to be measured vary, it is unnecessary to perform conversion operations on the pressure member 113 with changes in the dimensions of the IC 104 to be treated.

Figure 16:
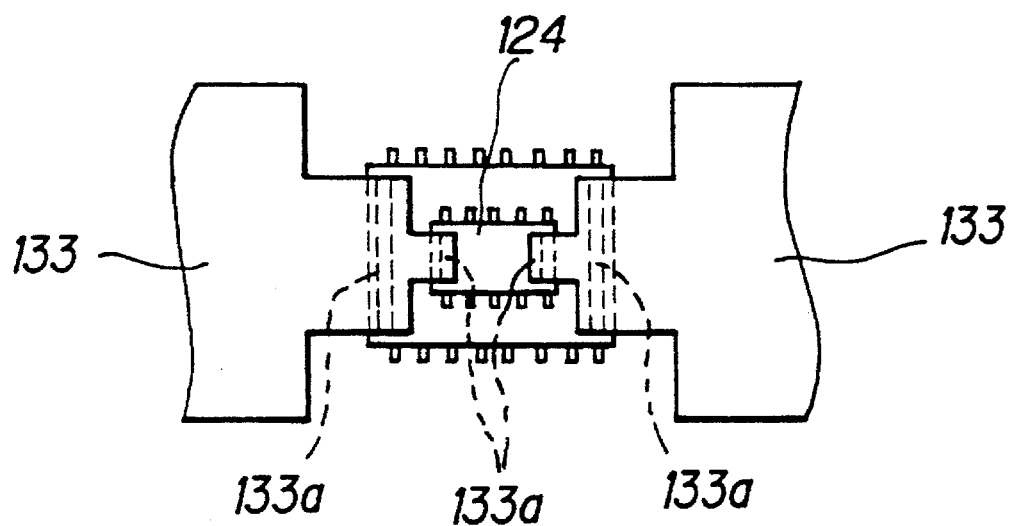
FIG. 16 is a drawing showing an example of a pressure member of a seventh embodiment of the present invention and the operation thereof, when applied to another type of IC.

Next, a seventh embodiment of the present invention will be described. Note that in the above-described embodiments explanation was given with respect to cases where a QFP-type IC 104 was depressed. However, in cases other than this, by forming the end shapes of the pressure member 113 stepwise in thin shapes as shown in FIG. 16 for example and providing pressure portions 113a at the thin portions thereof, the pressure member 113 can be made to correspond to an SOP-type IC 124.

According to the present invention as described above, since the guide members provided at the periphery of the mold-receiving base are separated corresponding to the leads of the IC and the ends of the probes are inserted and disposed in these separation portions, when the IC to be measured is mounted in the mold-receiving base in a state where the top surface thereof is facing downwards, because the mold body is guided by the guiding portions and the outer leads do not contact and deform the guide members of the socket or the like, solder junction deficiencies, short circuits between the leads and the like which give rise to lead deformation when the IC is mounted are prevented and mechanical reliability is improved, and improvement in production yields can be expected.

Also, according to the present invention, with respect to the IC mounted in the mold-receiving base, by applying pressure on the bottom surface of the mold body from above with a handling means, the root portions of the outer leads are brought into contact with the probes disposed in the separation portions of the guide members and conductivity can be achieved between the outer leads and the probes, thus rendering unnecessary provision of contactors separate to the handling means as in the prior art, thereby simplifying the structure of the device.

Further according to the present invention, with respect to the IC mounted in the mold-receiving base by the handling means, by applying pressure on the bottom surface of the mold body from above by means of the pressure member, the root portions of the outer leads are brought into contact with the probes disposed in the separation portions of the guide members and conductivity can be achieved between the outer leads and the probes. Consequently, since the next IC to be measured can be suction-supported by the handling means while the pressure member is applying pressure to the mold body, then the IC after measuring can be extracted from the socket, making it possible to mount the next IC to be measured in the mold-receiving base immediately thereafter, high performance measuring and testing can be expected.

In addition, according to the present invention, with respect to the IC mounted in the mold-receiving base by the handling means, since the present invention is devised so that a conductive state can be achieved between the outer leads and the probes by applying pressure to the bottom surface of the mold body from above by means of the handling means or pressure member, it can be made to correspond to any package shape in which the IC has shoulder portions at the root portions of the outer leads.

What is claimed is:

1. An IC measuring and testing device comprising:

a measurement handler socket;

a mold-receiving base biasingly supported on the measurement handler socket and having around its periphery guide members corresponding to a shape of an IC mold body to be measured and probes for contacting outer leads of an IC the mold receiving base having an IC mold body receiving surface within said periphery; and a handling means for suction-supporting the IC and mounting it in the mold-receiving base, the IC measuring and testing device performing measuring and testing of the IC mounted on the mold-receiving base by means of the handling means, wherein:

the guide members are provided on each side of the mold receiving base;

the mold receiving base includes slots between the guide members, which slots extend partially into the IC mold body receiving surface;

the guide members separate corresponding outer leads of the IC, and end portions of the probes are arranged so as to be inserted into the slots; and the guide members extend above the IC mold body receiving surface of the mold body receiving base.

2. The IC measuring and testing device according to claim 1, further comprising a pressure member for applying pressure from above on the IC mounted in the mold-receiving base by the handling means, via the mold body.

3. The IC measuring and testing device according to claim 1, further comprising guide members at four sides of the mold-receiving base, which is four-sided.

4. A method for performing measuring and testing of an IC in an IC measuring and testing device, comprising the steps of:

suction-supporting the IC to be measured by means of a handling means;

mounting the IC, suction-supported by the handling means, facing a mold-receiving base in a state where a top surface of a mold body of the IC is facing downward, the mold-receiving base having a mold body receiving surface about which are positioned a plurality of guide members, said guide members extending above the mold body receiving surface and having positioned between the slots which extend partially into the IC mold body receiving surface; and applying pressure on a bottom surface of the mold body of the IC from above by means of the handling means, to bring root portions of outer leads extending from the mold body into contact with probe terminal portions positioned in the slots and between respective guide members so that the outer leads and the probes are caused to conduct electricity.

5. A method for performing measuring and testing of an IC in an IC measuring and testing device, comprising the steps of:

suction-supporting the IC to be measured by means of a handling means;

mounting the IC, suction-supported by the handling means, facing a mold-receiving base in a state where a top surface is facing downward, the mold-receiving base having a mold body receiving surface about which are positioned a plurality of guide members, said guide members extending above the mold body receiving surface and having positioned between them slots which extend partially into the mold body receiving surface; and applying pressure on a bottom surface of a mold body of the IC from above by means of a pressure member to bring root portions of outer leads extending from the mold body into contact with probe terminal portions positioned in the slots and between respective guide members so that the outer leads and the probes are caused to conduct electricity.

\* \* \* \* \*